(12) United States Patent
Ichihara et al.

(10) Patent No.: US 8,410,556 B2
(45) Date of Patent: *Apr. 2, 2013

(54) SEMICONDUCTOR DEVICE

(75) Inventors: Reika Ichihara, Yokohama (JP); Masato Koyama, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/290,552

(22) Filed: Nov. 7, 2011

(65) Prior Publication Data

US 2012/0049289 A1 Mar. 1, 2012

Related U.S. Application Data

(62) Division of application No. 12/491,728, filed on Jun. 25, 2009, now Pat. No. 8,076,732.

(30) Foreign Application Priority Data

Jun. 27, 2008 (JP) ................. 2008-169074

(51) Int. Cl.
 *H01L 29/78* (2006.01)
 *H01L 29/43* (2006.01)

(52) U.S. Cl. ............. 257/369; 257/407; 257/E29.128; 257/E29.16

(58) Field of Classification Search .......... 257/369, 257/402, 407, 405, E21.635, E21.637, 392, 257/E29.16, E29.128, E29.134

See application file for complete search history.

(56) References Cited

U.S. PATENT DOCUMENTS 7,807,522 B2 * 10/2010 Alshareef et al. ............ 438/176

(Continued)

FOREIGN PATENT DOCUMENTS

| JP | 2006-245324 A | 9/2006 |
| JP | 2007-110091 A | 4/2007 |

(Continued)

OTHER PUBLICATIONS

C. Ren, et al., "Work-Function Tuning of TaN by High-Temperature Metal Intermixing Technique for Gate-First CMOS Process", IEEE Electron Device Letters, vol. 27, No. 10, Oct. 2006, pp. 811-813.

(Continued)

*Primary Examiner* — Calvin Lee
*Assistant Examiner* — Scott Stowe
(74) *Attorney, Agent, or Firm* — Oblon, Spivak, McClelland, Maier & Neustadt, L.L.P.

(57) ABSTRACT

A semiconductor device includes pMISFET and nMIS formed on the semiconductor substrate. The pMISFET includes, on the semiconductor substrate, first source/drain regions, a first gate dielectric formed therebetween, first lower and upper metal layers stacked on the first gate dielectric, a first upper metal layer containing at least one metallic element belonging to groups IIA and IIIA. The nMISFET includes, on the semiconductor substrate, second source/drain regions, second gate dielectric formed therebetween, a second lower and upper metal layers stacked on the second gate dielectric and the second upper metal layer substantially having the same composition as the first upper metal layer. The first lower metal layer is thicker than the second lower metal layer, and the atomic density of the metallic element contained in the first gate dielectric is lower than the atomic density of the metallic element contained in the second gate dielectric.

4 Claims, 11 Drawing Sheets

U.S. PATENT DOCUMENTS

| | | | |
|---|---|---|---|
| 7,863,695 B2 * | 1/2011 | Suzuki et al. | 257/411 |
| 7,968,956 B2 * | 6/2011 | Tatsumura et al. | 257/412 |
| 2005/0285208 A1 | 12/2005 | Ren et al. | |
| 2007/0052037 A1 | 3/2007 | Luan | |
| 2007/0057335 A1 | 3/2007 | Tsuchiya et al. | |
| 2009/0014809 A1 | 1/2009 | Sekine et al. | |
| 2009/0218634 A1 * | 9/2009 | Sakashita et al. | 257/369 |
| 2010/0308418 A1 | 12/2010 | Stahrenberg et al. | |

FOREIGN PATENT DOCUMENTS

| | | | |
|---|---|---|---|
| JP | 2007-173412 A | 7/2007 | |
| JP | 2008-147239 A | 6/2008 | |
| JP | 2009-267180 A | 11/2009 | |

OTHER PUBLICATIONS

H.Y. Yu, et al., "Low $V_t$ Ni-FUSI CMOS Technology using a DyO cap layer with either single or dual Ni-phases", 2007 Symposium on VLSI Technology Digest of Technical Papers, pp. 18-19.

Office Action mailed Jan. 29, 2013 in Japanese Patent Application No. 2008-169074 filed Jun. 27, 2008 (With English Translation).

* cited by examiner

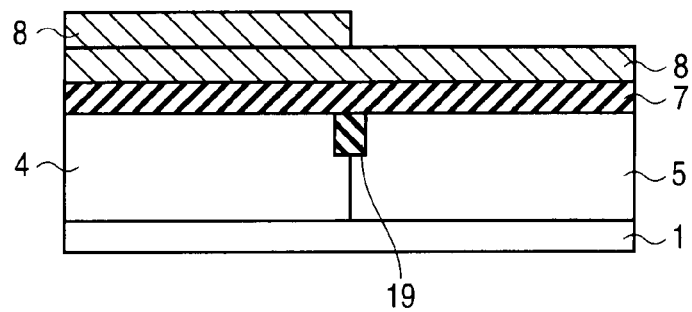
F I G. 7
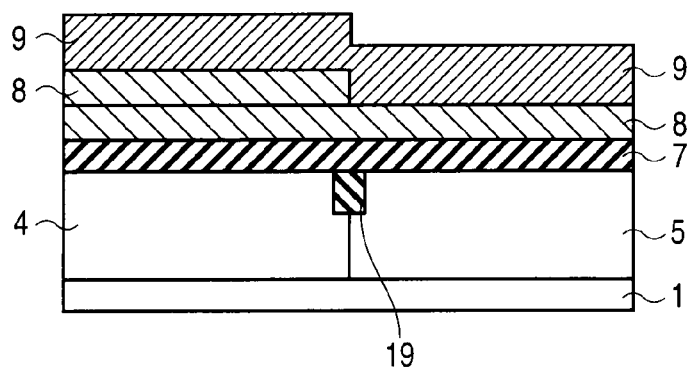
F I G. 8
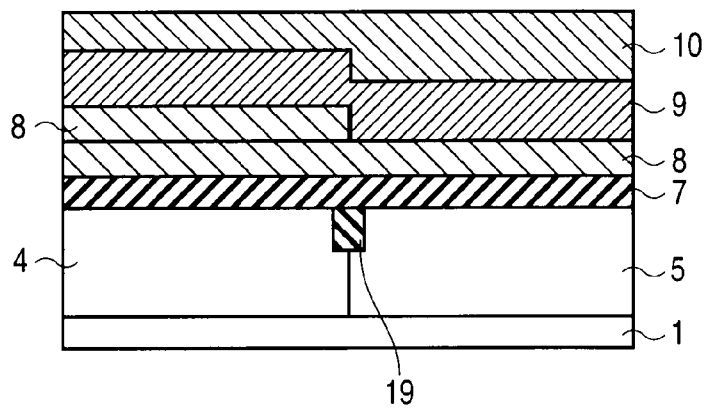
F I G. 9

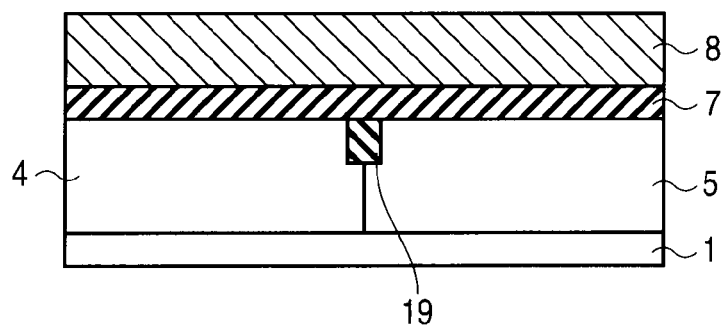
F I G. 10
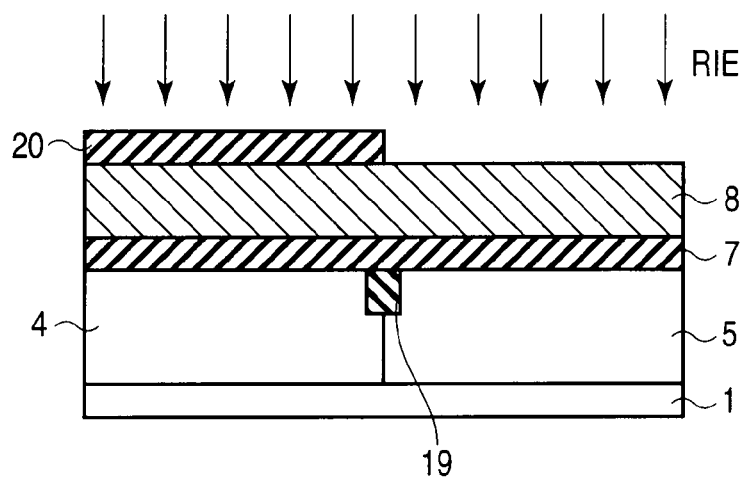
F I G. 11
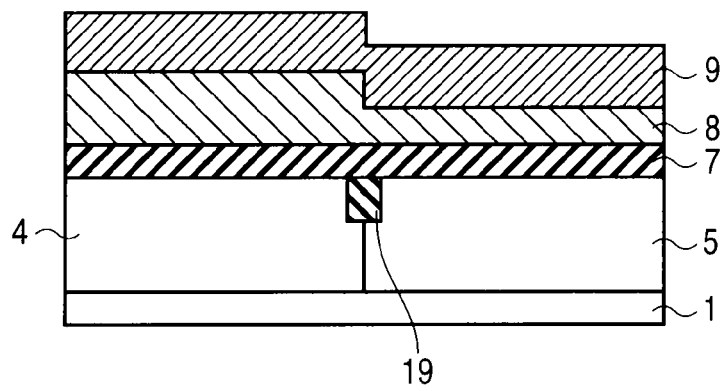
F I G. 12

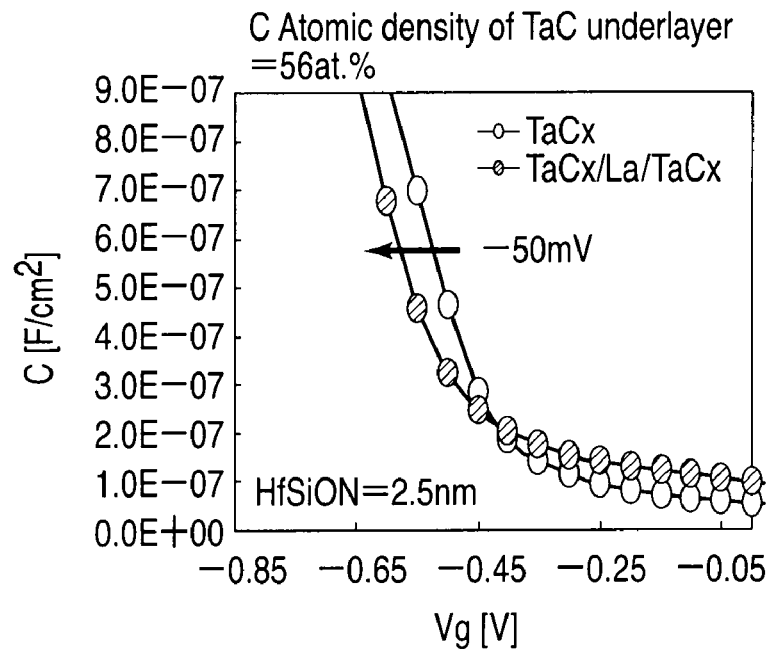
F I G. 16
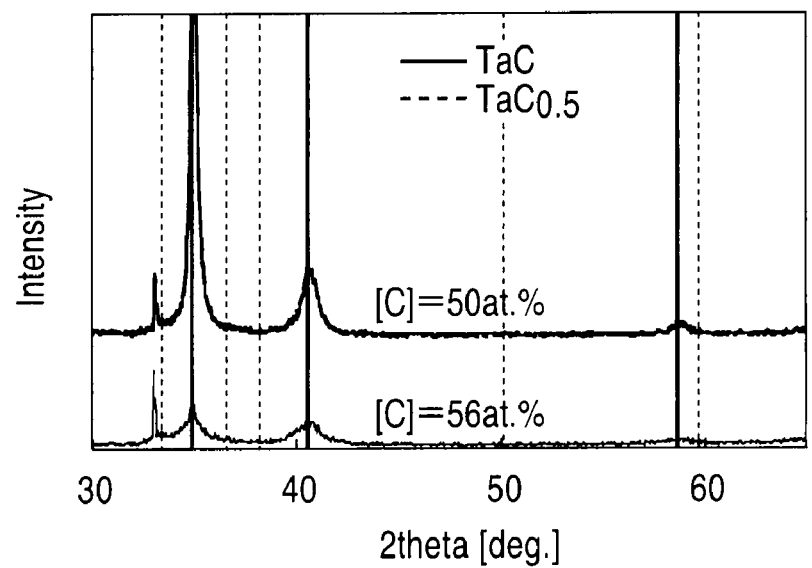
F I G. 17

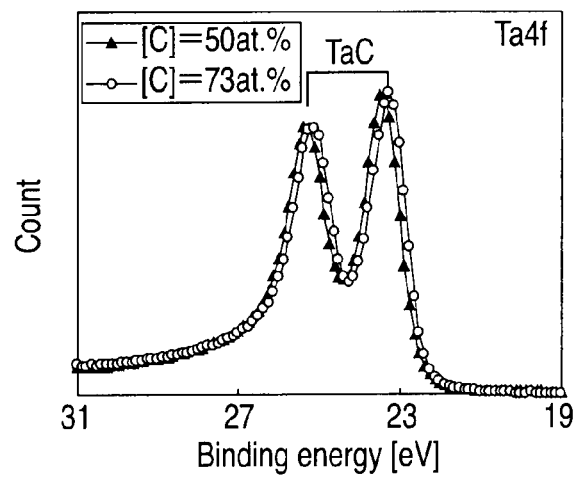
F I G. 18A
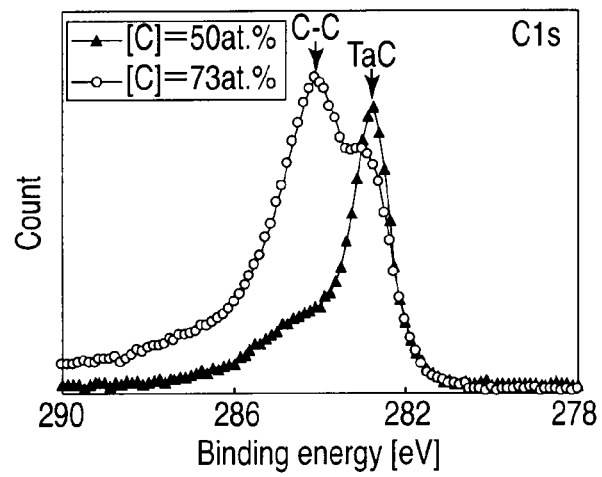
F I G. 18B
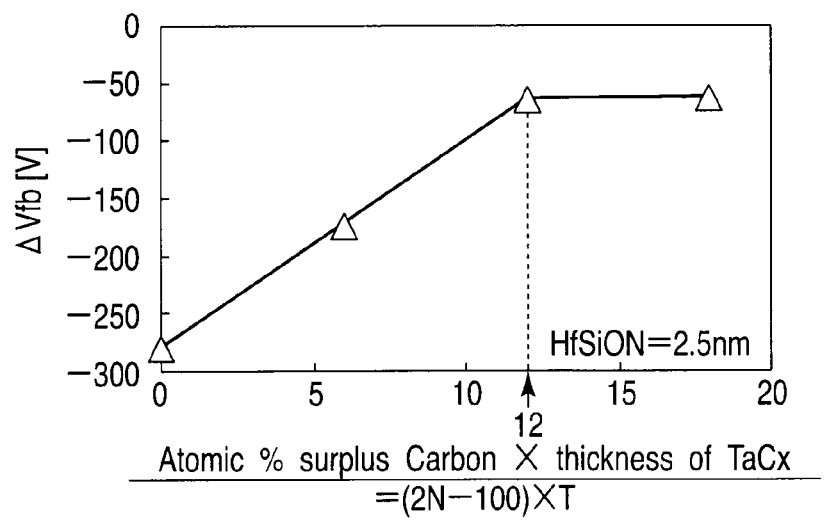
F I G. 19

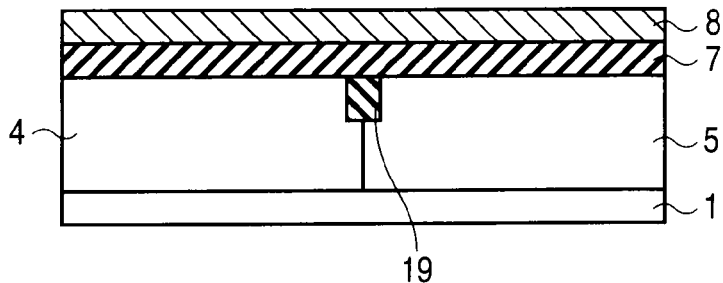
F I G. 20
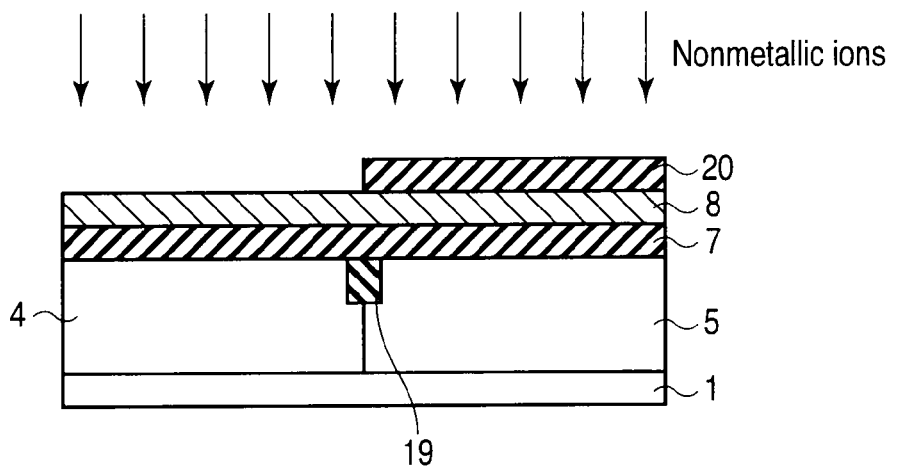
F I G. 21
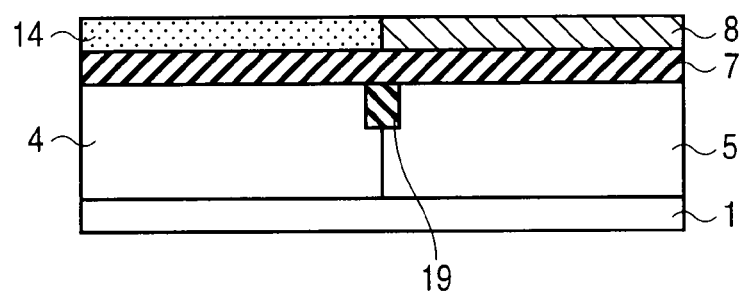
F I G. 22

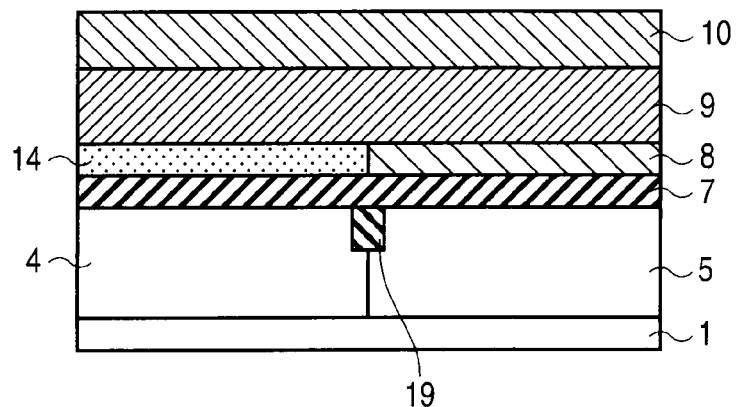
F I G. 23
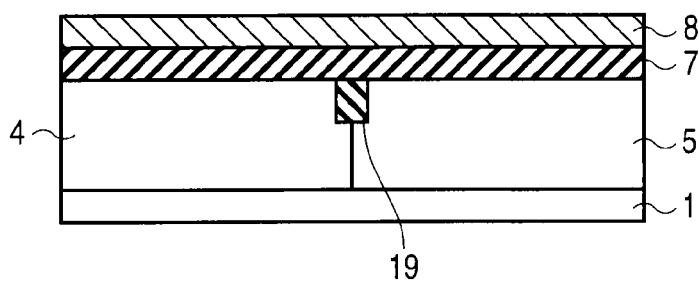
F I G. 24
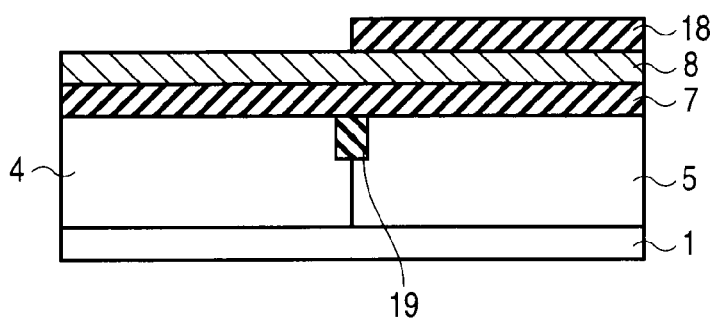
F I G. 25
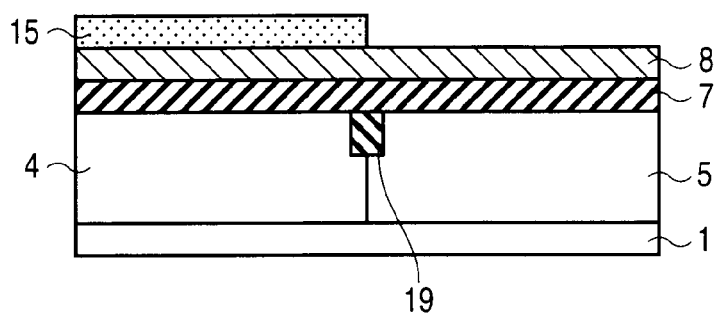
F I G. 26

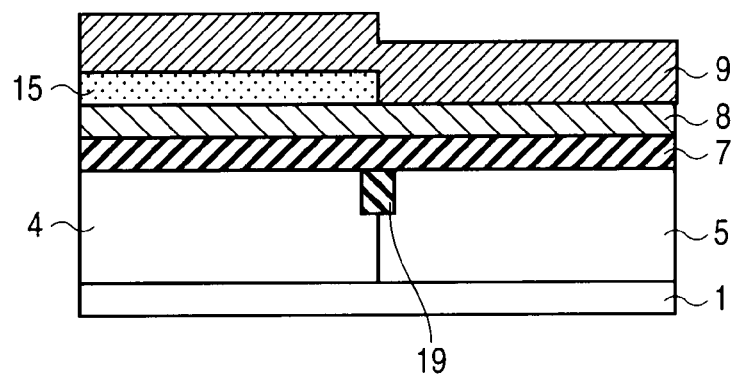
F I G. 27
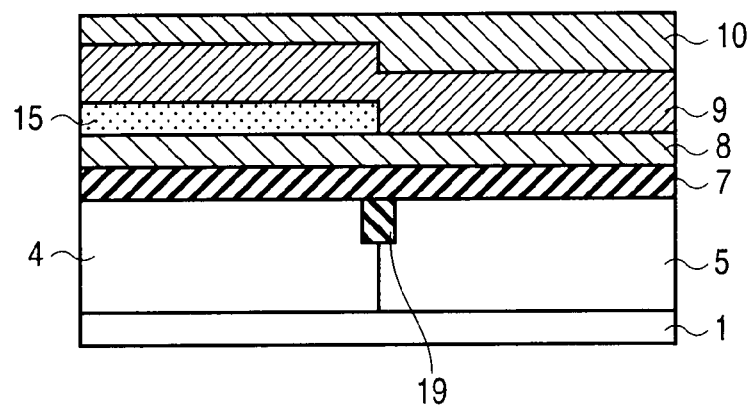
F I G. 28
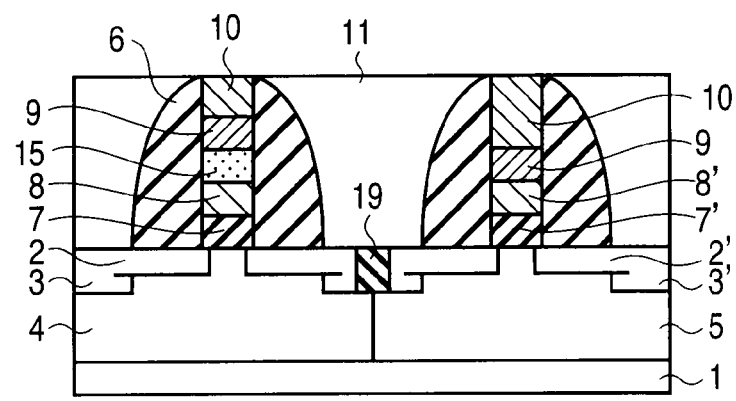
F I G. 29

US 8,410,556 B2

SEMICONDUCTOR DEVICE

CROSS-REFERENCE TO RELATED APPLICATIONS

This application is a division of and claims the benefit of priority under 35 U.S.C. §119 from U.S. Ser. No. 12/491,728 filed Jun. 25, 2009, and claims the benefit of priority under 35 U.S.C. §120 from Japanese Patent Application No. 2008-169074 filed Jun. 27, 2008, the entire contents of each of which are incorporated herein by reference.

BACKGROUND OF THE INVENTION

1. Field of the Invention

The present invention relates to a structure of a complementary metal insulator semiconductor device (CMIS) using a metal gate electrode, and a manufacturing method thereof.

2. Description of the Related Art

In order to meet the requirements for an effective reduction in the thickness of a gate insulating film associated with increasing performance and increasing integration of semiconductor devices, it will be necessary in the future to introduce the technique for a metal gate electrode and a high dielectric (high-k) gate insulating film. To obtain proper performance in a CMIS transistor (cMISFET) using the metal/high-k gate insulating film, an effective work function $\phi$eff of a metal gate material needs to be about 3.9 to 4.3 eV for an n-channel MIS transistor (nMISFET), and about 4.8 to 5.2 eV for a p-channel MIS transistor (pMISFET).

However, a metal having a low work function suitable for the n-channel MIS transistor is generally not stable in a heat treatment step necessary for a transistor formation process, and cannot have a $\phi$eff of about 3.9 to 4.3 eV suitable for the n-channel MIS transistor especially on the high-k gate insulating film after the formation of the transistor. Therefore, insertion of a layer containing groups IIA and IIIA metallic elements into a gate stack structure is necessary, which is effective as a technique of reducing Vth in the n-channel MISFET.

On the other hand, the layer containing the groups IIA and IIIA metallic elements increases Vth in the p-channel MIS transistor, so that there is a need for a step of detaching the layer containing the groups IIA and IIIA metallic elements in the p-channel MISFET region.

However, the layer containing the groups IIA and IIIA metallic elements is generally low in resistance to an etching solution (e.g., refer to H. Y. Yu et al., Tech. VLSI, P18 (2007)). Accordingly, there has been concern that the layer containing the groups IIA and IIIA metallic elements in the n-channel MISFET region may also be detached in the step of detaching the layer containing the groups IIA and IIIA metallic elements in the p-channel MISFET region or in an associated mask detaching step, and proper Vth modulation may not be obtained in the n-channel MISFET region.

Thus, there has been desired the realization of a CMIS structure which inhibits the effects of the Vth modulation by the layer containing the groups IIA and IIIA metallic elements in the p-channel MISFET region without performing the step of detaching the layer containing the groups IIA and IIIA metallic elements formed in the p-channel MISFET region.

BRIEF SUMMARY OF THE INVENTION

According to a first aspect of the invention, there is provided a semiconductor device, which includes:

a semiconductor substrate;

an n-type semiconductor region and a p-type semiconductor region provided on the semiconductor substrate to be insulated from each other;

a p-channel MIS transistor formed on the n-type semiconductor region; and an n-channel MIS transistor formed on the p-type semiconductor region, the p-channel MIS transistor including:

first source/drain regions provided opposite to each other on the n-type semiconductor region;

a first gate insulating film formed on the n-type semiconductor region between the first source/drain regions;

a first lower metal layer formed on the first gate insulating film; and a first upper metal layer formed on the first lower metal layer and containing at least one metallic element belonging to groups IIA and IIIA, the n-channel MIS transistor including:

second source/drain regions provided opposite to each other on the p-type semiconductor region;

a second gate insulating film formed on the p-type semiconductor region between the second source/drain regions;

a second lower metal layer formed on the second gate insulating film; and a second upper metal layer formed on the second lower metal layer and substantially having the same composition as the first upper metal layer, wherein the first lower metal layer is thicker than the second lower metal layer, and the atomic density of the metallic element contained in the first gate insulating film is lower than the atomic density of the metallic element contained in the second gate insulating film.

According to a second aspect of the invention, there is provided a method of manufacturing a semiconductor device which includes:

forming a first gate insulating film and a second gate insulating film on an n-type semiconductor region and a p-type semiconductor region of a semiconductor substrate, respectively, the n-type semiconductor region and the p-type semiconductor region being insulated from each other;

forming a first lower metal layer and a second lower metal layer, on the first gate insulating film and the second gate insulating film, respectively, the first lower metal layer being greater in thickness than the second lower metal layer; and forming, on the first and second lower metal layers, first and second upper metal layers containing at least one metallic element belonging to groups IIA and IIIA.

BRIEF DESCRIPTION OF THE SEVERAL VIEWS OF THE DRAWING

FIGS. 5 to 9 are sectional views for stepwise explanations of a first manufacturing method of the semiconductor device according to the first embodiment;

FIGS. 10 to 13 are sectional views for stepwise explanations of a second manufacturing method of the semiconductor device according to the first embodiment;

FIG. 16 shows the CV characteristics of the MIS capacitor which uses a TaCx gate electrode as one electrode and the CV characteristics of a MIS capacitor which uses a TaCx/LaOx/TaCx gate electrode as one electrode, wherein the C atomic density of the TaCx underlayer in TaCx/LaOx/TaCx is 56 at. %;

FIG. 17 shows XRD peak profiles of TaCx having a C atomic density of 50 at. % and TaCx having a C atomic density of 56 at. %;

FIGS. 18A and 18B are graphs of XPS spectra of TaCx having a C atomic density of 50 at. % and TaCx having a C atomic density of 73 at. %, wherein FIG. 18A shows a Ta4f spectrum and FIG. 18B shows a C1s spectrum;

FIG. 19 is a graph in which a Vfb modulation amount ΔVfb attributed to the introduction of LaOx into a gate electrode is plotted with respect to the product of the density of surplus carbon in a TaCx underlayer and the thickness of the TaCx underlayer;

FIGS. 20 to 23 are sectional views for stepwise explanations of a first manufacturing method of the semiconductor device according to the second embodiment; and FIGS. 24 to 29 are sectional views for stepwise explanations of a second manufacturing method of the semiconductor device according to the second embodiment.

DETAILED DESCRIPTION OF THE INVENTION

According to the present embodiments described hereinafter, it is possible to provide a CMIS structure which inhibits the effects of Vth modulation by a layer containing groups IIA and IIIA metallic elements in a p-channel MISFET region.

The embodiments will be described with reference to the drawings.

(First Embodiment)

Figure 1:
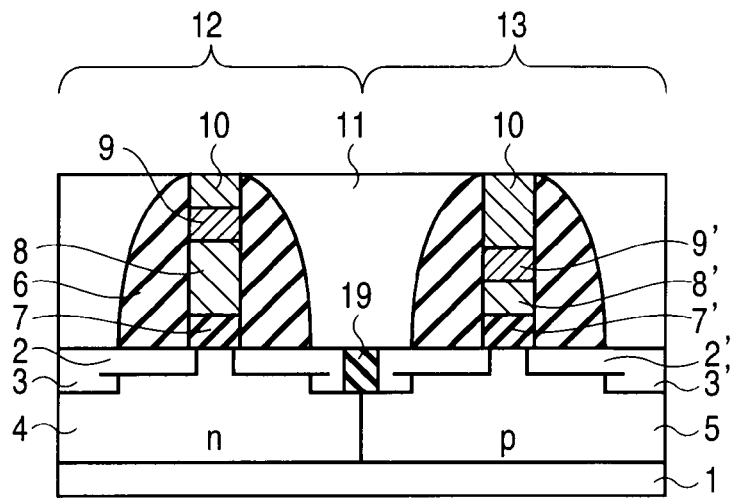
FIG. 1 is a sectional view of a CMIS semiconductor device according to a first embodiment.

FIG. 1 is a sectional view of a semiconductor device according to a first embodiment of the present invention. An n-type semiconductor region 4 and a p-type semiconductor region 5 which are insulated from each other by a shallow trench isolation (STI) 19 are provided in a surface region of an Si substrate 1 as a semiconductor substrate. A p-channel MISFET 12 and an n-channel MISFET 13 are formed in the respective semiconductor regions. The n- and p-type semiconductor regions 4, 5 are formed as so-called wells.

A high-k gate insulating film (dielectric) 7 such as HfSiON is formed on the surface of the n-type semiconductor region 4. A gate insulating film 7' is formed on the surface of the p-type semiconductor region 5, and this gate insulating film 7' is based on a high-k gate insulating film such as HfSiON and contains at least one of groups IIA and IIIA metallic elements (e.g., Mg, Ca, Sr, Ba, Sc, Y, La, Ce, Pr, Nd, Pm, Sm, Eu, Gd, Tb, Dy, Ho, Er, Tm, Yb, Lu).

In addition, the gate insulating films 7 and 7' are referred to here because a subsequent step brings about a difference between the gate insulating film in the n-type semiconductor region and the gate insulating film in the p-type semiconductor region. There is not always a need for a process of separately forming the gate insulating films in the n- and p-type semiconductor regions. Similar signs are also used in the embodiment described later.

A lower gate electrode layer 8 based on, for example, TaC is formed on the gate insulating film 7 located on the n-type semiconductor region. A lower gate electrode layer 8' based on, for example, TaC is formed on the gate insulating film 7' located on the p-type semiconductor region. Here, the thickness of the lower gate electrode layer 8 is greater than the thickness of the lower gate electrode layer 8'. A layer 9 containing at least one of groups IIA and IIIA metallic elements is formed on the lower gate electrode layer 8 and the lower gate electrode layer 8'. That is to say, the composition of the layer 9 is substantially the same on the lower gate electrode layer 8 and the lower gate electrode layer 8'. On the layer 9, there is further formed an upper gate electrode layer 10 composed of a high-melting-point metal such as TiNx, TaCx or W, a polysilicon electrode, or a stacked structure of these materials.

Figure 2:
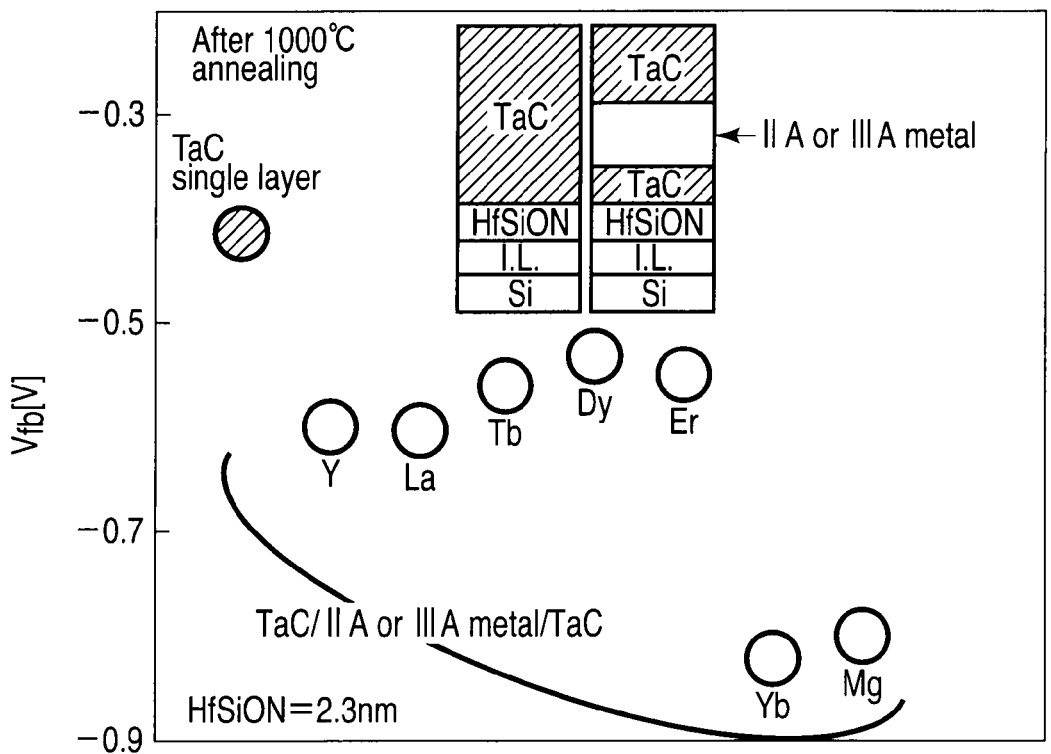
FIG. 2 is a schematic diagram showing a flat band voltage (Vfb) calculated from the CV characteristics of MIS capacitors, wherein one of the MIS capacitors has been subjected to annealing at 1000° C. and subsequent foaming gas annealing at 450° C. for 30 minutes after the formation of a TaC/HfSiON/Si structure, while the other MIS capacitor has been subjected to annealing at 1000° C. and subsequent foaming gas annealing at 450° C. for 30 minutes after the formation of a TaC/(IIA or IIIA metal containing layer)/HfSiON/Si structure with respect to various metals.

FIG. 2 shows Vfb of two MIS capacitors formed on the semiconductor substrate in comparison. One of the two capacitors is composed of a TaC gate electrode, an HfSiON gate insulating film and the semiconductor substrate. The other is composed of a TaC/(IIA or IIIA metal)/TaC gate electrode, an HfSiON gate insulating film and the silicon substrate. These capacitors have been subjected to annealing at 1000° C. and subsequent foaming gas annealing (FGA).

In addition, the indication "I.L." in the diagram of FIG. 2 and representing a gate stack structure means an interfacial layer formed between HfSiON and Si, and this interfacial layer is mainly composed of $SiO_2$. The I.L. is also naturally formed when HfSiON is directly formed on Si. However, $SiO_2$ may be formed on Si as the I.L. before the formation of HfSiON.

Furthermore, in the gate electrode composed of TaC/(IIA or IIIA metal)/TaC, a TaC layer in contact with the gate insulating film will hereinafter be described as a "TaC underlayer". Here, the thickness of the TaC underlayer is 1.5 nm. A lower Vfb is shown when TaC/(IIA or IIIA metal)/TaC is used as the gate electrode than when Tac is used as the gate electrode, which proves that the effects of reducing Vfb are obtained by the IIA, IIIA metal.

Figure 3A:
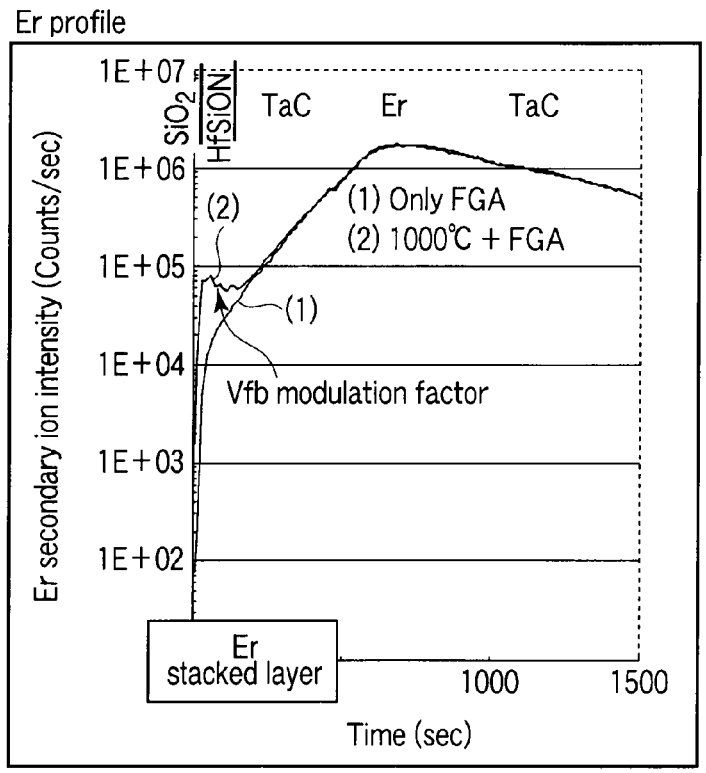
FIGS. 3A and 3B show profiles of secondary ion intensities found out by a backside SIMS analysis of the MIS capacitor which has been subjected to annealing at 1000° C. and subsequent foaming gas annealing at 450° C. for 30 minutes after the formation of a TaC/(Er or Yb)/TaC/HfSiON/Si structure, wherein the profile for Er is shown in FIG. 3A, and the profile for Yb is shown in FIG. 3B.
Figure 3B:
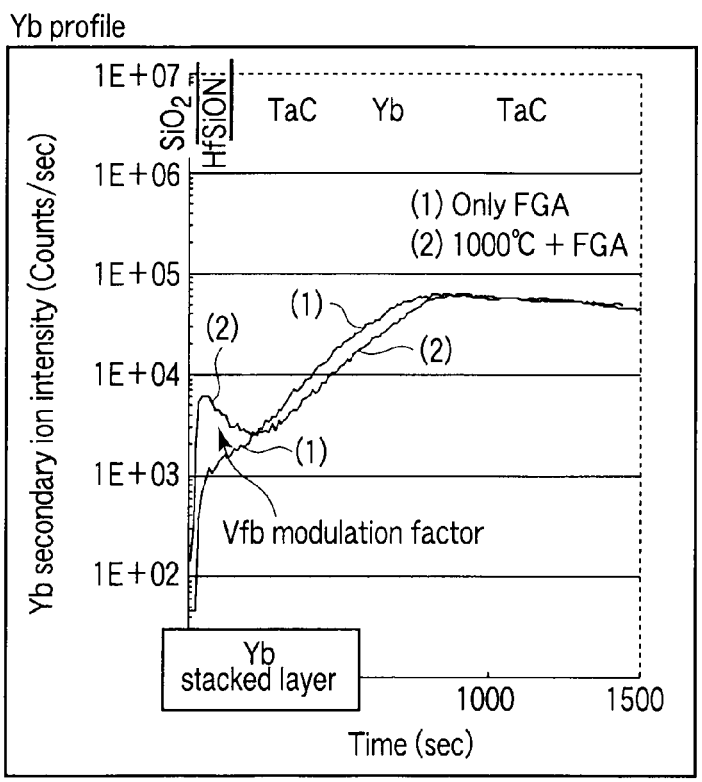

FIGS. 3A and 3B are graphs wherein Er or Yb is used as the IIA, IIIA metal, and the distributions of Er and Yb in the gate stack before and after annealing at 1000° C. are shown. Er or Yb diffuses from an Er layer or a Yb layer toward an HfSiON/I.L./Si structure due to the annealing at 1000° C. The diffused Er or Yb negatively modulates Vfb. That is to say, in order to obtain the Vfb modulation, the group IIA or IIIA metallic element has to diffuse toward the HfSiON/I.L./Si structure.

Figure 4:
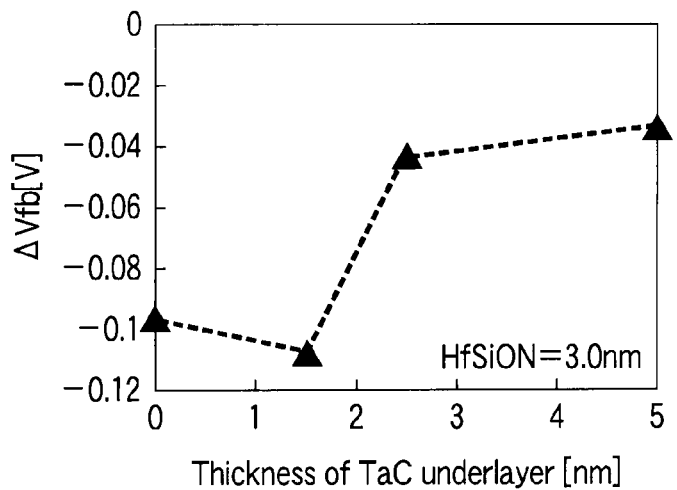
FIG. 4 is a graph in which a Vfb modulation amount ΔVfb attributed to the introduction of Er into a gate electrode is plotted with respect to the thickness of a TaC underlayer.

Next, there will be shown how the diffusion of the group IIA or IIIA metallic element toward the HfSiON/I.L./Si structure depends on the thickness of the TaC underlayer. FIG. 4 is a graph in which a Vfb modulation amount attributed to the introduction of Er into the gate electrode after the annealing at 1000° C. and the subsequent FGA is plotted with respect to the thickness of the TaC underlayer. Here, a Vfb modulation amount can be represented by Equation (1):

$$\Delta Vfb = Vfb(\text{TaC/Er/TaC/HfSiON/Si}) - Vfb(\text{TaC/HfSiON/Si}) \quad (1)$$

It is apparent that the effects of Vfb modulation by Er decreases along with an increase in the thickness of the TaC underlayer.

As described above, the Vfb modulation is caused by the diffusion of the group IIA or IIIA metallic element toward the HfSiON/I.L./Si structure. Therefore, it is presumed that if the thickness of the TaC underlayer increases, the amount of the diffusion of Er toward the HfSiON/I.L./Si structure decreases so that the effects of Vfb modulation are inhibited.

That is to say, if the TaC underlayer in the n-channel MISFET is thin and the TaC underlayer in the p-channel MISFET is thick, Vth can be sufficiently reduced in the n-channel MISFET by the group IIA or IIIA metallic element even when the layer 9 containing at least one of groups IIA and IIIA metallic elements of the same thickness is formed on the TaC underlayer in the n-channel MISFET and the p-channel MISFET. On the other hand, Vth is not increased in the p-channel MISFET by the groups IIA and IIIA metallic elements. That is to say, there is no need to detach the layer 9 formed in the p-channel MISFET, and the associated instability of Vth due to the detachment of the layer 9 in the n-channel MISFET can be avoided.

Furthermore, when the thickness of the TaC underlayer in the p-channel MISFET is greater than the thickness of the TaC underlayer in the n-channel MISFET as described above, the atomic density of the "metallic element diffusing from the layer 9" contained in the gate insulating film 7 in the p-channel MISFET is lower than the atomic density of the "metallic element diffusing from the layer 9" contained in the gate insulating film 7' in the n-channel MISFET.

Moreover, as apparent from FIG. 4, if the TaC underlayer is 1.5 nm or less, about the same amount of Vfb modulation is obtained as that in the case (the TaC underlayer: 0 nm) where the layer 9 is in direct contact with the gate insulating film. On the other hand, if the TaC underlayer is 2.5 nm or more, the effect of inhibiting the Vfb modulation tends to be saturated. That is to say, the thickness of the TaC underlayer in the n-channel MISFET is desirably 1.5 nm or less and that the thickness of the TaC underlayer in the p-channel MISFET is desirably 2.5 nm or more.

Although the C/Ta ratio in the TaC underlayer is 1 in the example described here, it should be understood that the C/Ta ratio may take a different value. For example, a C/Ta ratio of unity or less is preferable in terms of mobility.

Moreover, although the lower metal layer is TaC in the example described here, the lower metal layer is not limited to TaC. For example, TiNx may be used for the lower metal layer. TiNx is known to be a metal having barrier properties against the diffusion of the metallic element similarly to TaC. That is to say, the amount of the diffusion of the metallic element is sufficiently sensitive to the thickness of the TiNx underlayer, so that the thickness of the TiNx underlayer can be varied to control the amount of the diffusion of the groups IIA and IIIA metallic elements into the gate insulating film.

Furthermore, Ti, which is a metallic element forming TiNx, is not bonded to the groups IIA and IIIA metallic elements similarly to Ta. Conversely, N, which is a nonmetallic element forming TiNx, is bonded to the groups IIA and IIIA metallic elements similarly to C. Thus, the Ti/N composition of the TiNx underlayer can be varied to control the amount of the diffusion of the groups IIA and IIIA metallic elements into the gate insulating film. That is to say, the advantage of the present embodiment can also be obtained when TiNx is used for the lower metal layer.

(First Manufacturing Method of the First Embodiment)

Next, a first manufacturing method of the semiconductor device in the first embodiment is described. This manufacturing method uses a so-called gate-first process for the manufacture of the transistor. The manufacturing steps are shown in FIGS. 5 to 9.

Figure 5:
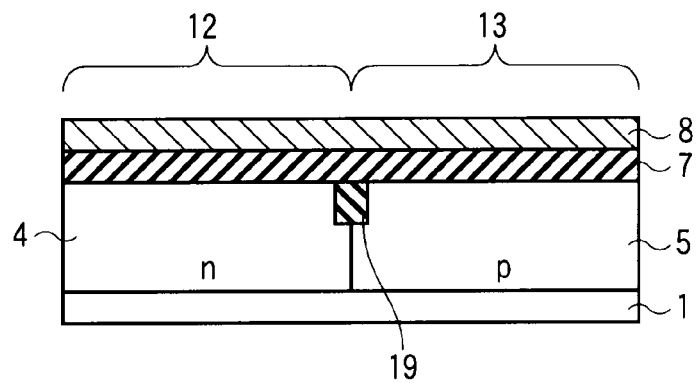

First, as shown in FIG. 5, a gate insulating film 7 is formed on an n-type semiconductor region 4 and a p-type semiconductor region 5 isolated from each other by a device isolation region 19 of an STI structure in a semiconductor substrate 1. Then, a lower gate electrode layer 8 is formed at a thickness between one mono layer and 1.5 nm inclusive on the gate insulating film 7. Here, HfSiON is formed as the gate insulating film 7 by a metal organic chemical vapor deposition (MOCVD) method, and TaC is formed as the lower gate electrode layer 8 by a sputtering method.

Figure 6:
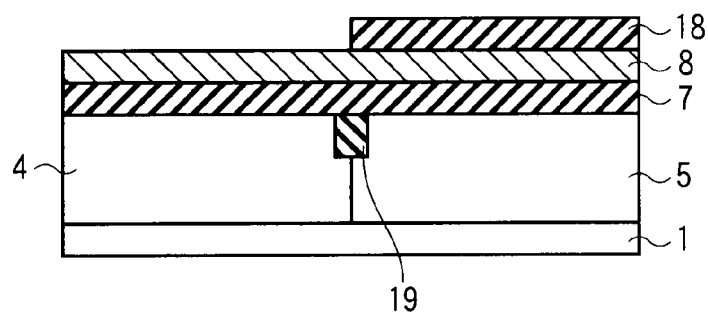

Then, as shown in FIG. 6, a mask material 18 composed of silicon oxide is formed on the lower gate electrode layer 8 located on the p-type semiconductor region 5. Further, the same material as that of the lower gate electrode layer 8 is formed on the lower gate electrode layer 8 and on the mask material 18 by a film formation method such as the sputtering method or CVD method so that the total thickness of the lower gate electrode layer 8 formed on the n-type semiconductor region 4 may be 2.5 nm or more. Here, TaC is formed by the sputtering method. The lower gate electrode layer 8 on the mask material 18 is detached together with the mask material 18 by a liftoff method to obtain a structure shown in FIG. 7.

Then, a layer 9 containing at least one of groups IIA and IIIA metallic elements is formed on the lower gate electrode layer 8 located on the n-type semiconductor region 4 and the p-type semiconductor region 5 (FIG. 8). Here, an Er layer is formed at 2.5 nm.

Subsequently, a gate electrode layer 10 composed of a high-melting-point metal such as TaCx, TiNx or W, a polysilicon electrode, or a stacked structure of these materials is formed on the layer 9 located on the n-type semiconductor region 4 and the p-type semiconductor region 5 (FIG. 9). Here, TaC is deposited as the gate electrode layer 10 by the sputtering method. Further, the stacked gate electrode layer and the gate insulating film are processed by, for example, lithography and reactive ion etching (RIE), and diffusion layers 3, 3' and extension regions 2, 2' are formed and heat treated by a normal semiconductor process, and then a sidewall layer 6 and an interlayer insulating film 11 are formed, thereby finally obtaining the structure shown in FIG. 1.

In addition, the gate insulating film and the lower gate electrode layer on the p-type semiconductor region 5 are indicated by 7' and 8' in FIG. 1, respectively. The reason is that there will be a difference between the gate insulating film and the lower gate electrode layer on the n-type semiconductor region 4 and the gate insulating film and the lower gate electrode layer on the p-type semiconductor region 5 due to metal atoms diffusing from the layer 9 to be contained in the gate insulating films and the lower gate electrode layers in a heat treatment step after the formation of a gate stack. The same holds true with the indications in the following embodiment.

(Second Manufacturing Method of the First Embodiment)

In the first manufacturing method, the lower gate electrode layer is additionally formed on the n-type semiconductor region 4 alone to make a difference in thickness between the lower gate electrode layer on the n-type semiconductor region 4 and the lower gate electrode layer on the p-type semiconductor region 5. Otherwise, the lower gate electrode layer on the p-type semiconductor region 5 alone may be reduced in thickness by etching to make a difference in thickness between the lower gate electrode layer on the n-type semiconductor region 4 and the lower gate electrode layer on the p-type semiconductor region 5. The manufacturing steps in such a case are shown in FIGS. 10 to 13.

First, as shown in FIG. 10, a gate insulating film 7 is formed on an n-type semiconductor region 4 and a p-type semiconductor region 5 isolated from each other by an element isolation region 19 of an STI structure in a semiconductor substrate 1. Then, a lower gate electrode layer 8 is formed at 2.5 nm or more on the gate insulating film 7. Here, HfSiON is formed as the gate insulating film 7 by the MOCVD method, and TaC is formed as the lower gate electrode layer 8 by the sputtering method.

Then, as shown in FIG. 11, a mask material 20 is formed on the lower gate electrode layer 8 located on the n-type semiconductor region 4. Further, the lower gate electrode layer 8 located on the p-type semiconductor region 5 which is not covered with the mask material is etched by such a method as RIE so that the thickness of the lower gate electrode layers 8 may be thinned to a thickness between one mono layer and 1.5 nm inclusive. Subsequently, the mask material 20 is detached.

Figure 13:
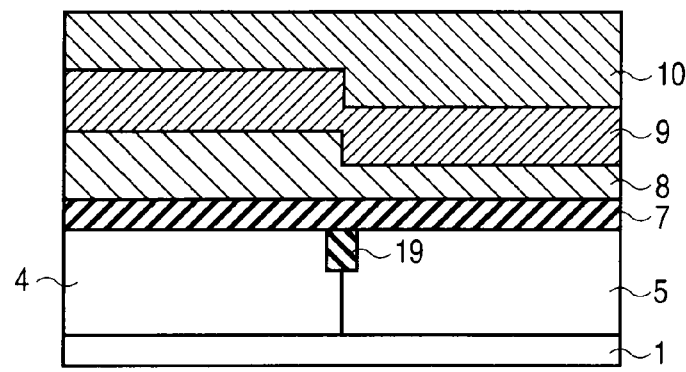

Then, a layer 9 containing at least one of groups IIA and IIIA metallic elements is formed on the lower gate electrode layer 8 located on the n-type semiconductor region 4 and the p-type semiconductor region 5, thereby obtaining a structure shown in FIG. 12. Here, an Er layer is formed at 2.5 nm. Subsequently, a gate electrode layer 10 composed of a high-melting-point metal such as $TaC_x$, $TiN_x$ or W, a polysilicon electrode, or a stacked structure of these materials is formed on the layer 9 located on the n-type semiconductor region 4 and the p-type semiconductor region 5 (FIG. 13).

Here, TaC is deposited as the gate electrode layer 10 by the sputtering method. Further, the stacked gate electrode layer and the gate insulating film are processed by, for example, lithography and etching such as RIE, and diffusion layers 3, 3', extension regions 2, 2', a sidewall layer 6 and an interlayer insulating film 11 are formed by a normal semiconductor process, thereby finally obtaining the structure shown in FIG. 1.

(First Modification of the First Embodiment)

In the case described in the first embodiment, the highly doped diffusion layers are used as source/drain regions. It goes without saying that a so-called Schottky transistor which uses source/drain electrodes as the source/drain regions is also applicable.

Here, the heat treatment process for the source/drain electrodes is generally carried out at 600° C. or less. Therefore, it is desired that heat treatment be performed after the formation of a layer 9 and before the formation of the source/drain electrodes, and metallic elements diffused in a gate insulating film be used to reduce a threshold voltage. In addition, the temperature of this heat treatment is preferably 1000° C. or more. Moreover, a proper upper limit is 1100° C. or less which is the heat resistance temperature of a general gate insulating film/gate electrode.

According to the first embodiment described so far, it is possible to provide, by the simple manufacturing method, a CMIS structure wherein the thickness of the lower metal layer in the p-channel MISFET region is greater than that of the metal underlayer in the n-channel MISFET so that the effects of Vth modulation by the layer containing the groups IIA and IIIA metallic elements in the p-channel MISFET region are inhibited.

(Second Embodiment)

Figure 14:
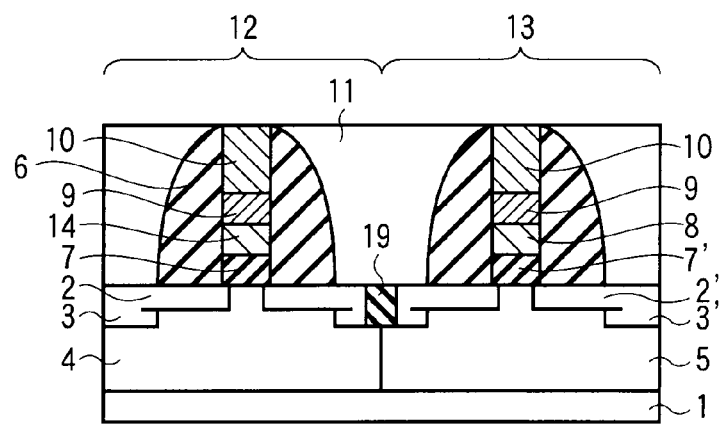
FIG. 14 is a sectional view of a CMIS semiconductor device according to a second embodiment.

FIG. 14 is a sectional view of a semiconductor device according to a second embodiment of the present invention. An n-type semiconductor region 4 and a p-type semiconductor region 5 are provided in a surface region of an Si substrate 1 as a semiconductor substrate. A p-channel MISFET 12 and an n-channel MISFET 13 are formed in the respective semiconductor regions. The n- and p-type semiconductor regions 4, 5 are formed as so-called wells.

A high-k gate insulating film 7 such as HfSiON is formed on the surface of the n-type semiconductor region 4. A gate insulating film 7' is formed on the surface of the p-type semiconductor region 5, and this gate insulating film 7' is based on a high-k gate insulating film such as HfSiON and contains at least one of groups IIA and IIIA metallic elements.

A lower gate electrode layer 14 based on, for example, $TaC_x$ is formed on the gate insulating film 7 located on the n-type semiconductor region. A lower gate electrode layer 8 based on, for example, $TaC_x$ is formed on the gate insulating film 7' located on the p-type semiconductor region. Here, the product of average density N1 of a nonmetallic element contained in the lower gate electrode layer 14 and thickness T1 of the lower gate electrode layer 14 is greater than the product of average density N2 of a nonmetallic element contained in the lower gate electrode layer 8 and thickness T2 of the lower gate electrode layer 8. In addition, the groups IIA and IIIA metallic elements contained in the lower gate electrode layer are not considered in the calculation of element density. For example, when the lower gate electrode layer is $TaC_x$ containing Er, the density of the nonmetallic element is represented by $$[C]=\{C/(Ta+C)\}\times 100 \qquad (2).$$

A layer 9 containing at least one of groups IIA and IIIA metallic elements is formed on the lower gate electrode layer 14 and the lower gate electrode layer 8. On the layer 9, there is further formed an upper gate electrode layer 10 composed of a high-melting-point metal such as $TiN_x$, $TaC_x$ or W, a polysilicon electrode, or a stacked structure of these materials.

Figure 15:
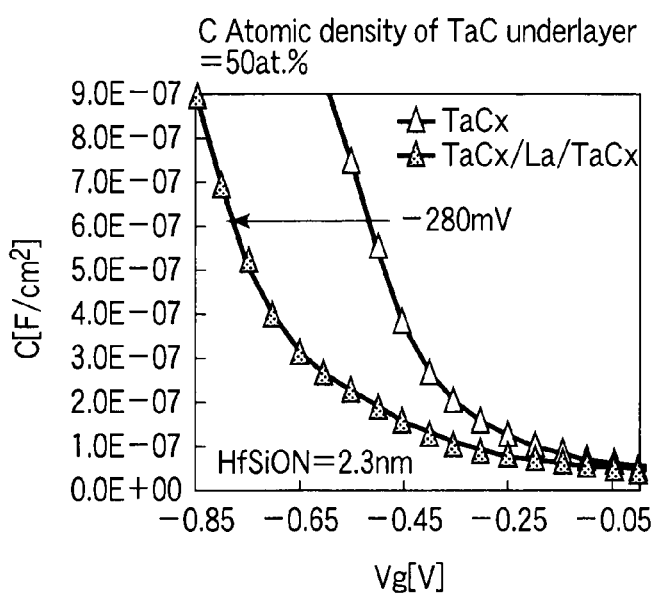
FIG. 15 shows the CV characteristics of a MIS capacitor which uses a TaCx gate electrode as one electrode and the CV characteristics of a MIS capacitor which uses a TaCx/LaOx/TaCx gate electrode as one electrode, wherein the C atomic density of the TaCx underlayer in TaCx/LaOx/TaCx is 50 at. %.

FIGS. 15 and 16 show the CV characteristics of a MIS capacitor in which one of gate electrodes $TaC_x$ and TaC/LaOx/TaC is formed as one electrode in the case where the C atomic density of a TaC underlayer is 50 at. % (FIG. 15) and in the case where the C atomic density of the TaC underlayer is 56 at. % (FIG. 16). HfSiON is used for the gate insulating films, and both of the gate insulating films have undergone annealing at 1000° C. and subsequent foaming gas annealing (FGA). It is apparent that the effects of Vfb reduction by the introduction of LaOx into the TaC electrode are decreased when the C atomic density of the TaC underlayer is 56 at. % than when the C atomic density of the TaC underlayer is 50 at. %.

It should be noted that La and C form a compound, so that C is bonded to La and thereby blocks the diffusion of La. On the other hand, Ta does not form an alloy with La. That is to say, when the TaC underlayer is richer in C, the diffusion of La causing the Vfb modulation toward the HfSiON/I.L./Si structure is more inhibited. Although La and TaC is used in the example given here, the group IIA or IIIA metallic element, in general, does not form an alloy with another metal but forms a compound with a nonmetallic element such as B, C, N or O. That is to say, the above-mentioned phenomenon is obtained both in the case where a group IIA or IIIA metallic element other than La is used and in the case where a material other than TaC is used for the lower gate electrode.

In other words, when the density of the nonmetallic element in the lower gate electrode layer in the p-channel MIS- FET is higher than the density of the nonmetallic element in the lower gate electrode layer in the n-channel MISFET, the advantage of the present embodiment can be obtained even if there is not a great difference or there is completely no difference, between the n-channel MISFET and the p-channel MISFET, in the thickness of the lower gate electrode layer.

Incidentally, it is anticipated that surplus nonmetallic elements which are not bonded to metals mainly make great contributions to the prevention of the diffusion of the metallic elements such as La. Here, a method of calculating the density of surplus C in TaCx is shown below. FIG. 17 shows X-ray diffraction (XRD) peak profiles of TaCx having a C atomic density of 56 at. % and TaCx having a C atomic density of 50 at. %. A peak of TaC (Ta:C=1:1) crystal is recognized in each case.

Furthermore, FIGS. 18A and 18B show X-ray photoelectron spectroscopy (XPS) of TaCx having a C atomic density of 73 at. % and TaCx having a C atomic density of 50 at. %, respectively. It is apparent that Ta4f shows peaks of TaC (Ta:C=1:1) independently of the C atomic density while C1s shows a peak attributed to single C in addition to a peak attributed to TaC when the C atomic density is 73 at. %. This means that TaCx having a C atomic density of 50 at. % or more is a mixture of TaC (1:1) crystal and single C. That is to say, it is considered that in TaCx having a C atomic density of 50 at. % or more, the same number of C as Ta is bonded to Ta, and the remaining C is surplus C which is not bonded to Ta. That is to say, the density of surplus C atoms (atomic % surplus carbon) in TaCx having a C density [C] equal to N1 can be represented as follows:

$$\text{Density of surplus C atoms (atomic \% surplus carbon)} = [C]-[Ta] = N1-(100-N1) = 2N1-100 \quad (3)$$

FIG. 19 is a graph in which a Vfb modulation amount (ΔVfb=Vfb(TaC/LaOx/TaC)−Vfb(TaC)) attributed to the introduction of an La containing layer into the TaC electrode is plotted with respect to the product (2N1−100)−T1 of the density (2N1−100) of surplus C atoms in a TaCx underlayer and the thickness (T1). It is apparent that the Vfb modulation amount is more inhibited when (2N−100) is higher and that the effect of inhibiting the Vfb modulation is substantially saturated in an area of (2N−100)≧12. Accordingly, the Vfb modulation can be sufficiently inhibited without detaching the layer 9 when the thickness (T1) of the TaCx underlayer and the average C atomic density (N1) in the p-channel MISFET satisfy the following equation:

$$(2N1-100) \times T1 \geq 12 \quad (4).$$

Furthermore, when the product (N1×T1) of density N1 of the nonmetallic element in the lower gate electrode in the p-channel MISFET and thickness T1 is greater than the product (N2×T2) of density N2 of the nonmetallic element in the lower gate electrode in the n-channel MISFET and thickness T2 as described above, the diffusion of the metallic element from the layer 9 in the p-channel MISFET is inhibited to a great extent. Thus, the atomic density of the "metallic element diffusing from the layer 9" contained in the gate insulating film 7 in the p-channel MISFET is lower than the atomic density of the "metallic element diffusing from the layer 9" contained in the gate insulating film 7' in the n-channel MISFET.

It is to be noted that TaCx whose [C] is greater than 50 at. % contains surplus C not bonded to Ta, and such surplus C hinders diffusion of IIA and IIIA elements from the upper layer. Therefore, [C] of the TaCx underlayer (that is N2) is preferably 50 at. % or less.

(First Manufacturing Method of the Second Embodiment)

Next, a first manufacturing method of the semiconductor device in the second embodiment is described. This manufacturing method uses the so-called gate-first process for the manufacture of the transistor. The manufacturing steps are shown in FIGS. 20 to 23.

First, as shown in FIG. 20, a gate insulating film 7 is formed on an n-type semiconductor region 4 and a p-type semiconductor region 5 isolated from each other by a device isolation region 19 of an STI structure in a semiconductor substrate 1. Then, the lower gate electrode layers 8 is formed at a thickness between one mono layer and 1.5 nm inclusive on the gate insulating film 7. Here, HfSiON is formed as the gate insulating film 7 by the MOCVD method, and TaC is formed as the lower gate electrode layer 8 by the sputtering method.

Then, as shown in FIG. 21, after a mask material 20 is formed on the lower gate electrode layer 8 located on the p-type semiconductor region 5, nonmetallic elements are ion-implanted from above the mask material 20 located on the p-type semiconductor region 5 and from above the lower gate electrode layer 8 located on the n-type semiconductor region 4 so that (2N1−100)×T1≧12 may finally be satisfied. Here, C is ion-implanted to form the lower gate electrode layer 14. Further, the mask material 20 located on the p-type semiconductor region 5 is detached to obtain a structure shown in FIG. 22.

Then, as shown in FIG. 23, a layer 9 containing at least one of groups IIA and IIIA metallic elements is formed on the lower gate electrode layer 8 located on the n-type semiconductor region 4 and the p-type semiconductor region 5. On the layer 9, there is formed an upper gate electrode layer 10 composed of a high-melting-point metal such as TaCx, TiNx or W, a polysilicon electrode, or a stacked structure of these materials. Here, TaC is deposited as the gate electrode layer 10 by the sputtering method.

Subsequently, the stacked gate electrode layer and the gate insulating film are processed by, for example, lithography and RIE, and diffusion layers 3, 3', extension regions 2, 2', a sidewall layer 6 and an interlayer insulating film 11 are formed by a normal semiconductor process, thereby finally obtaining the structure shown in FIG. 14.

In addition, the gate insulating film located on the p-type semiconductor region 5 is indicated by 7' in FIG. 14. The reason is that there will be a difference between the gate insulating film on the p-type semiconductor region 5 and the gate insulating film on the n-type semiconductor region 4 due to metal atoms diffusing from the layer 9 to be contained in the gate insulating films and the lower gate electrode layers in a heat treatment step after the formation of a gate stack.

(Second Manufacturing Method of the Second Embodiment)

In the first manufacturing method, the nonmetallic elements are implanted into the lower gate electrode layer located on the n-type semiconductor region 4 alone to make a difference of nonmetallic elements between the lower gate electrode layer on the n-type semiconductor region 4 and the lower gate electrode layer on the p-type semiconductor region 5. Otherwise, a nonmetallic element layer is additionally formed on the lower gate electrode layer located on the n-type semiconductor region 4 alone to make a difference in thickness and a difference in the density of the nonmetallic elements between the lower gate electrode layer on the n-type semiconductor region 4 and the lower gate electrode layer on the p-type semiconductor region 5. The manufacturing steps of this method are shown in FIGS. 24 to 29.

First, as shown in FIG. 24, a gate insulating film 7 is formed on an n-type semiconductor region 4 and a p-type semiconductor region 5 isolated from each other by an element isolation region 19 of an STI structure in a semiconductor substrate 1. Then, the lower gate electrode layers 8 is formed at a thickness between one mono layer and 1.5 nm inclusive on the gate insulating film 7. Here, HfSiON is formed as the gate insulating film 7 by the MOCVD method, and TaC is formed as the lower gate electrode layer 8 by the sputtering method.

Then, as shown in FIG. 25, a mask material 18 composed of silicon oxide is formed on the lower gate electrode layer 8 located on the p-type semiconductor region 5. Further, a nonmetallic element layer 15 is formed on the lower gate electrode layer 8 and on the mask material 18 by a film formation method such as the sputtering method or CVD method. In this case, thickness T1 of the nonmetallic element layer is adapted to satisfy $(2N1-100) \times T1 \geq 12$ wherein N1 is the average density of the nonmetallic element in the entire stacked structure of the lower gate electrode layer 8 and the nonmetallic element layer 15. T1 is the thickness of the entire stacked structure of the lower gate electrode layer 8 and the nonmetallic element layer 15. Here, C is formed as the nonmetallic element layer 15 by the sputtering method. Subsequently, the nonmetallic element layer 15 on the mask material 18 is detached together with the mask material 18 by a liftoff method to obtain a structure shown in FIG. 26.

Then, as shown in FIG. 27, a layer 9 containing at least one of groups IIA and IIIA metallic elements is formed on the nonmetallic element layer 15 located on the n-type semiconductor region 4 and the lower gate electrode layer 8 located on the p-type semiconductor region 5. Here, an Er layer is formed as the layer 9 at 2.5 nm.

Subsequently, as shown in FIG. 29, a gate electrode layer 10 composed of a high-melting-point metal such as TaCx, TiNx or W, a polysilicon electrode, or a stacked structure of these materials is formed on the layer 9 located on the n-type semiconductor region 4 and the p-type semiconductor region 5. Here, TaC is deposited as the gate electrode layer 10 by the sputtering method. Subsequently, the stacked gate electrode layer and the gate insulating film are processed by, for example, lithography and RIE, and diffusion layers 3, 3', extension regions 2, 2', a sidewall layer 6 and an interlayer insulating film 11 are formed by a normal semiconductor process, thereby finally obtaining the structure shown in FIG. 29.

(Second Modification)

In the case described in the second embodiment, the high-density impurity diffusion layers are used as source/drain regions. It goes without saying that a so-called Schottky transistor which uses source/drain electrodes as the source/drain regions is also applicable.

Here, the heat treatment process for the source/drain electrodes is generally carried out at 600° C. or less. Therefore, it is desired that heat treatment be performed after the formation of a layer 9 and before the formation of the source/drain electrodes, and metallic elements diffused in a gate insulating film be used to reduce a threshold voltage. In addition, the temperature of this heat treatment is preferably 1000° C. or more. Moreover, a proper upper limit is 1100° C. or less which is the heat resistance temperature of a general gate insulating film/gate electrode.

According to the second embodiment, it is possible to provide a CMIS structure wherein the nonmetallic elements are simply implanted into or deposited on the lower metal layer in the p-type semiconductor region so that the effects of Vth modulation by the layer containing the groups IIA and IIIA metallic elements in the p-channel MISFET region are inhibited.

While the present invention has been described above through the embodiments, the present invention is not exclusively limited to the embodiments described above, and various modifications to components can be made at the stage of carrying out the invention without departing from the spirit thereof. For example, in a FIN MISFET using a plate-shaped (linear) semiconductor layer as an active region, the present invention can be applied when the groups IIA and IIIA metallic elements are used for a fine adjustment of a threshold value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
an n-type semiconductor region and a p-type semiconductor region provided on the semiconductor substrate to be insulated from each other;
a p-channel MIS transistor formed on the n-type semiconductor region; and
an n-channel MIS transistor formed on the p-type semiconductor region,
the p-channel MIS transistor including:
first source/drain regions provided opposite to each other on the n-type semiconductor region;
a first gate insulating film formed on the n-type semiconductor region between the first source/drain regions;
a first lower metal layer formed on the first gate insulating film and containing a first nonmetallic element; and
a first upper metal layer formed on the first lower metal layer and containing at least one metallic element belonging to groups IIA and IIIA,
the n-channel MIS transistor including:
second source/drain regions provided opposite to each other on the p-type semiconductor region;
a second gate insulating film formed on the p-type semiconductor region between the second source/drain regions;
a second lower metal layer formed on the second gate insulating film and containing a second nonmetallic element; and
a second upper metal layer formed on the second lower metal layer and substantially having the same composition as the first upper metal layer,
wherein a first product (N1×T1) of an average nonmetallic atom density (N1) (atomic percentage is used as a unit) in the first lower metal layer and a thickness (T1) of the first lower metal layer is greater than a second product (N2×T2) of an average nonmetallic atom density (N2) (atomic percentage is used as a unit) in the second lower metal layer and a thickness (T2) of the second lower metal layer, in which the at least one metallic element diffusing from the first and second upper metal layers is excluded from a density calculation; and
the density of the at least one metallic element contained in the first gate insulating film is lower than the density of the at least one metallic element contained in the second gate insulating film.

2. The semiconductor device according to claim 1, wherein the first and second lower metal layers contain tantalum carbide.

3. The semiconductor device according to claim 2, wherein the N1 and T1 satisfy $(2N1-100) \times T1 \geq 12$.

4. The semiconductor device according to claim 3, wherein the N2 satisfies $N2 \leq 50$ atomic percent, and T2 satisfies $T2 \leq 1.5$ nm.

* * * * *